United States Patent [19]
Wang

[11] Patent Number: 6,078,092
[45] Date of Patent: Jun. 20, 2000

[54] RESETTABLE FUSE INTEGRATED CIRCUIT PACKAGE

[75] Inventor: Bily Wang, Hsin-Chu, Taiwan

[73] Assignee: Harvatek Corporation, Hsin-Chu, Taiwan

[21] Appl. No.: 09/419,308
[22] Filed: Oct. 18, 1999
[51] Int. Cl.[7] .......................... H01L 29/00; H01L 23/58; H01L 23/62
[52] U.S. Cl. ............................. 257/529; 257/665
[58] Field of Search ..................... 257/529, 665

[56] References Cited

U.S. PATENT DOCUMENTS 5,672,905  9/1997  Lee et al. .
5,808,351  9/1998  Nathan et al. .
5,895,942  4/1999  Deguchi .

Primary Examiner—David E. Graybill
Attorney, Agent, or Firm—H. C. Lin Patent Agent

[57] ABSTRACT

A resettable fuse is connected in series with a bonding pad of an IC chip, In the presence of a high voltage surge, the resettable fuse breaks the connection temporary. After the surge is over, the resettable reset itself and the IC resumes operation.

5 Claims, 7 Drawing Sheets

RESETTABLE FUSE INTEGRATED CIRCUIT PACKAGE

BACKGROUND OF THE INVENTION (1) Field of the Invention

This invention is related to integrated circuit package, in particular to package with surge protection.

(2) Description of the Related Art

Conventional integrated circuit (IC) package has no protection against electrical surges or electrostatic discharge When an accidental voltage appears at the input or output terminals of an integrated circuit package, permanent damage may be inflicted to the integrated circuit.

In the case of electrostatic discharge, the high voltage occurs only momentarily and decays rapidly. The situation can be simulated by the discharge of a capacitor. For such a situation, protection is needed is only during the short discharge period.

SUMMARY OF THE INVENTION

An object of this invention is to protect an integrated circuit against electrical surge. Another object of this invention is to break the connection to an IC momentarily in the presence of electrical surge but reset the connection afterwards. Another object of this invention is to incorporate a resettable fuse in the IC package.

These objects are achieved by connecting a resettable fuse in series with the input and output terminals of an IC. The resettable fuse is mounted on the package, breaks up the circuit connection momentarily, and resets itself afterwards.

BRIEF DESCRIPTIONS OF SEVERAL VIEWS OF THE DRAWING

DETAILED DESCRIPTION OF THE INVENTION

Figure 1A:
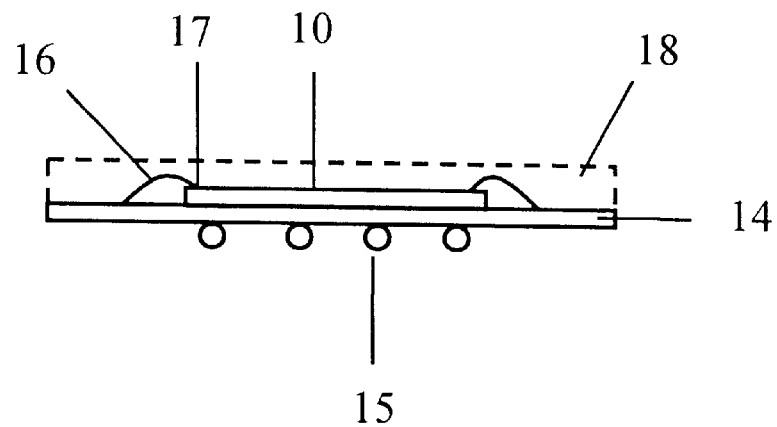
FIG. 1A shows the side view of a traditional IC package without fusing.
Figure 1B:
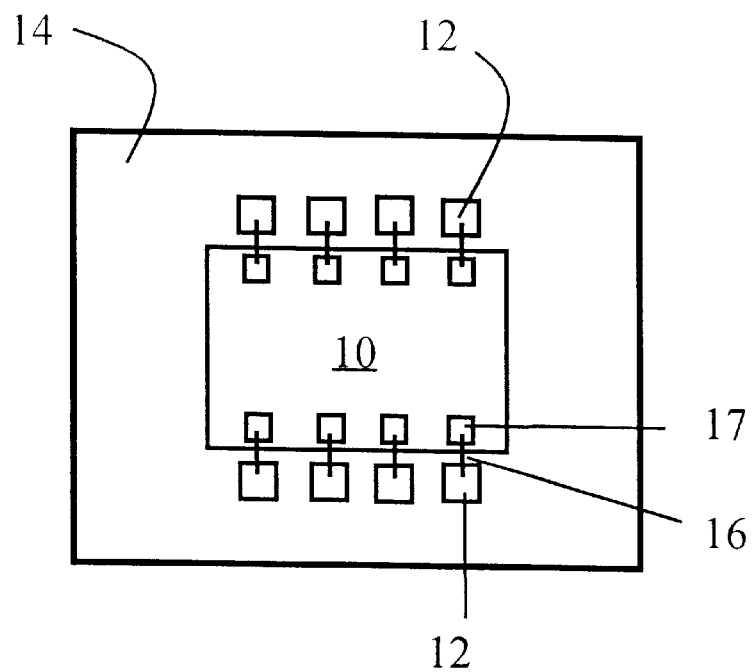
FIG. 1B shows top view of FIG. 1B.

FIG. 1A shows the side view of a conventional integrated circuit package. An IC chip 10 is mounted on a substrate 14. The bonding pads 17 of the IC are wire bonded by bonding wires 16 to terminals 12 on the substrate 10 as shown in the top view FIG. 1B. After wire-bonding the package is sealed with glue 18 to protect the IC chip.

Figure 2A:
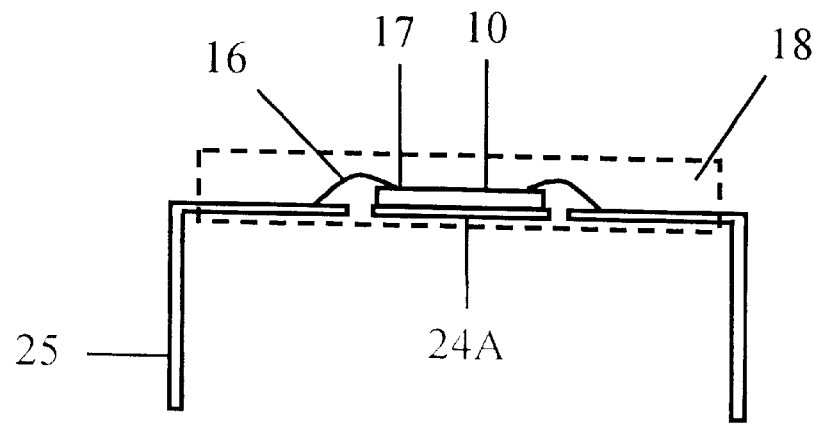
FIG. 2A shows the side view of an IC package with bent leads.
Figure 2B:
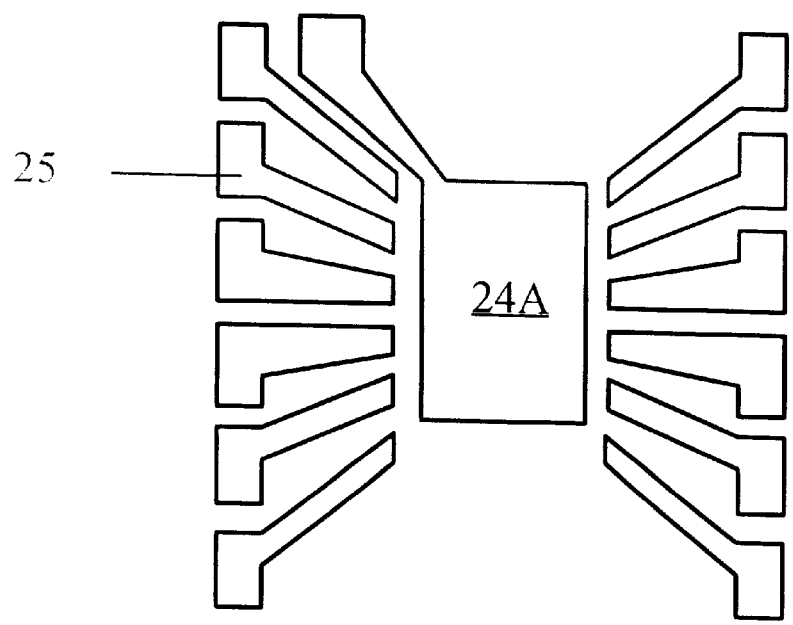
FIG. 2B shows the top view of FIG. 2A.

FIG. 2A shows the side view of another prior art package, in which the IC chip 10 is mounted on a metal plate 24A as a heat sink for the IC chip 10. On the same sheet of metal as the heat sink 24A are patterned with metal extensions 25 as shown in FIG. 2B serving as terminals for the IC chip and bent at the ends for plugging into a printed circuit board. Each bonding pad 17 of the IC chip 10 is bonded by wire 16 to an extension 25. After wire bonding the package is sealed in resin 18.

Figure 3:
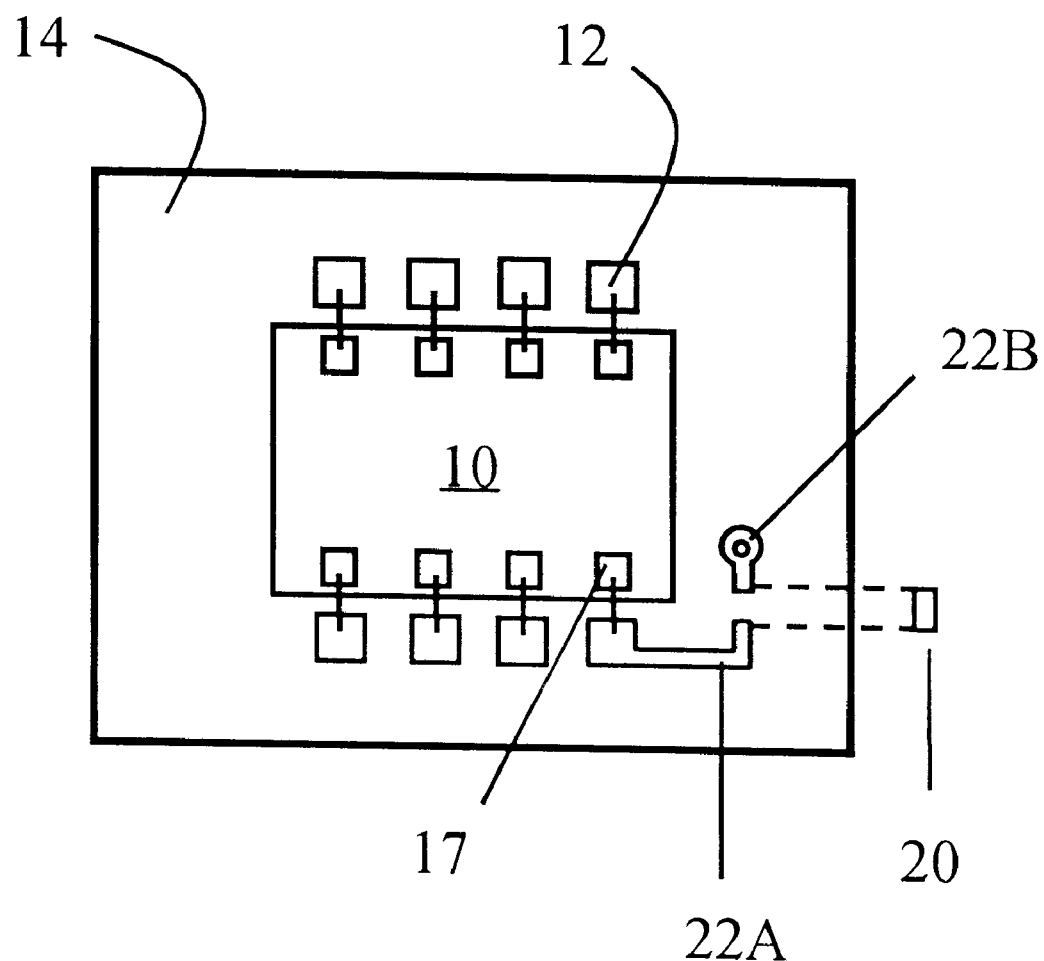
FIG. 3 shows the top view of an IC package with a resettable fuse based on the present invention.

FIG. 3 show a first embodiment of the present invention. The IC chip 10, the substrate 14, the bonding pads 17 and the terminals have the same functions as the corresponding parts in FIG. 1A. In addition, at least one bonding pad 17 is connected in series with a resettable fuse 20 to a terminal 22B through a link 22A. Such a resettable fuse is made of polymer, which is conductive when normal voltage is applied but becomes an insulator when overvoltage is applied, and is available in miniature size with a diameter about 0.5–0.8 mm and a length of about 1.5–2.0 mm. The terminal 22B is a terminal which may experience high surge voltage. When a surge voltage appears at terminal 22B, the resettable fuse 20 breaks and opens the circuit connection. After a transient period of the surge is likely over, the resettable fuse resets itself and the IC can function normally.

Figure 4A:
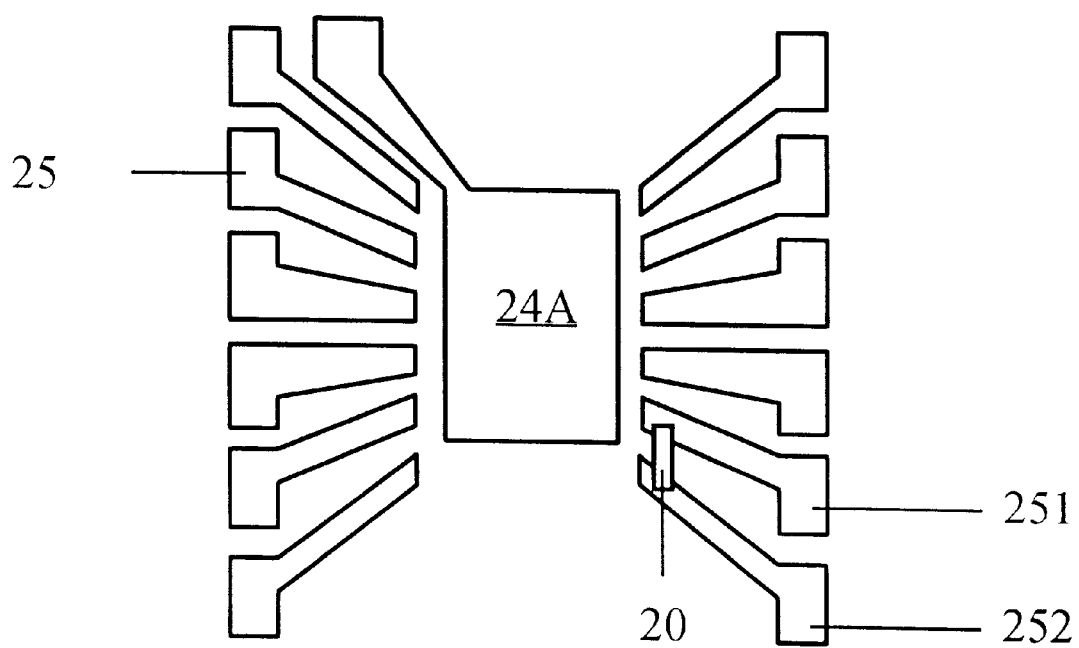
FIG. 4A shows another embodiment of an IC package with a resettable fuse.

FIG. 4A shows another embodiment of the present invention. The package correspond to the package shown in FIG. 2B with corresponding part reference numbers: 24A as heat sink., 25 as as extension, One of the extensions 251, which needs surge protection, is only connected to a bonding pad of the IC but not connected to an external connection. The extension 251 is connected to a resettable fuse 20 to another extension 252, which serves as the external terminal. When a voltage surge appears at the terminal 252, the resettable fuse breaks the circuit connection temporarily, After the surge is over, the resettable fuse resets itself and resumes operation.

Figure 4B:
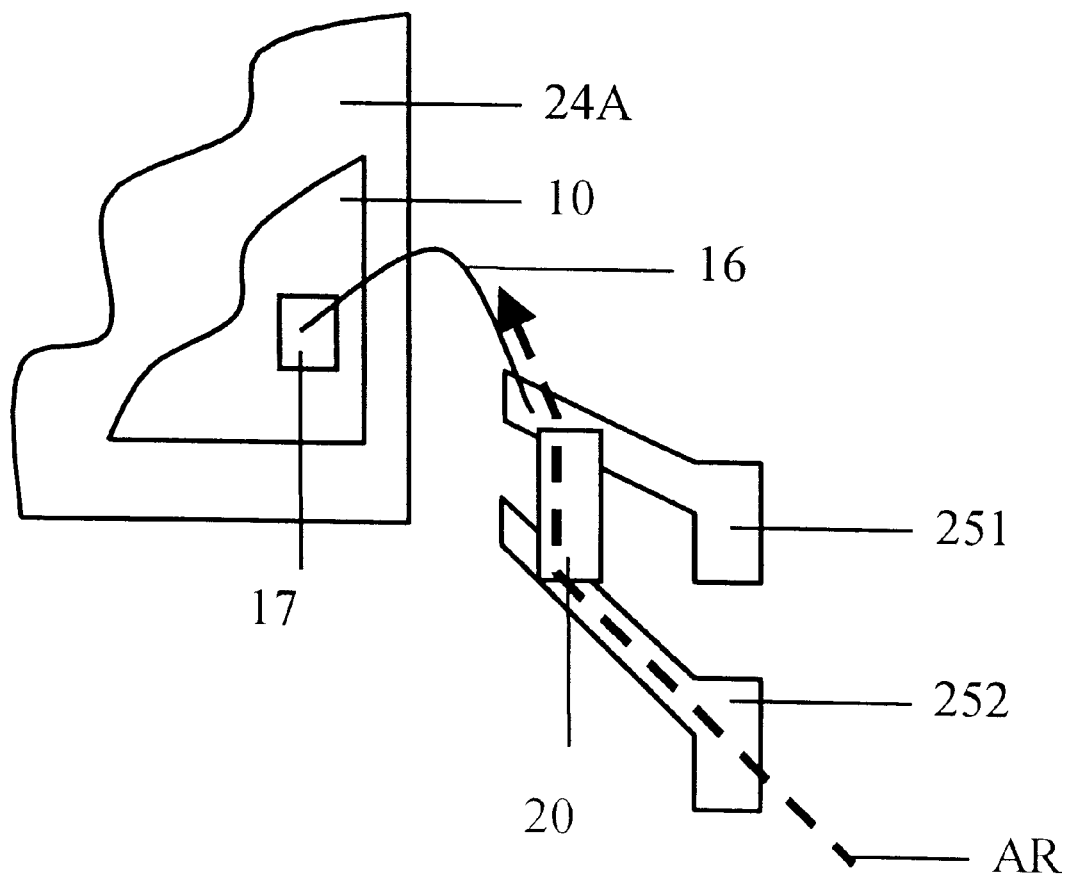
FIG. 4B shows a detailed connection of the resettable fuse.

FIG. 4B shows the detailed connection of the resettable fuse 20 shown in FIG. 4A. The IC chip 10 is mounted on a heat sink 24A. the bonding pad 17 of the IC chip 10 is wire-bonded to extension 251 through a bonding wire 16. The resettable fuse 20 bridges across the extension 251 and the extension 252. When a voltage surge appears at the terminal 252, the surge voltage is impressed on the IC pad 17 along the dotted line AR.

Figure 5A:
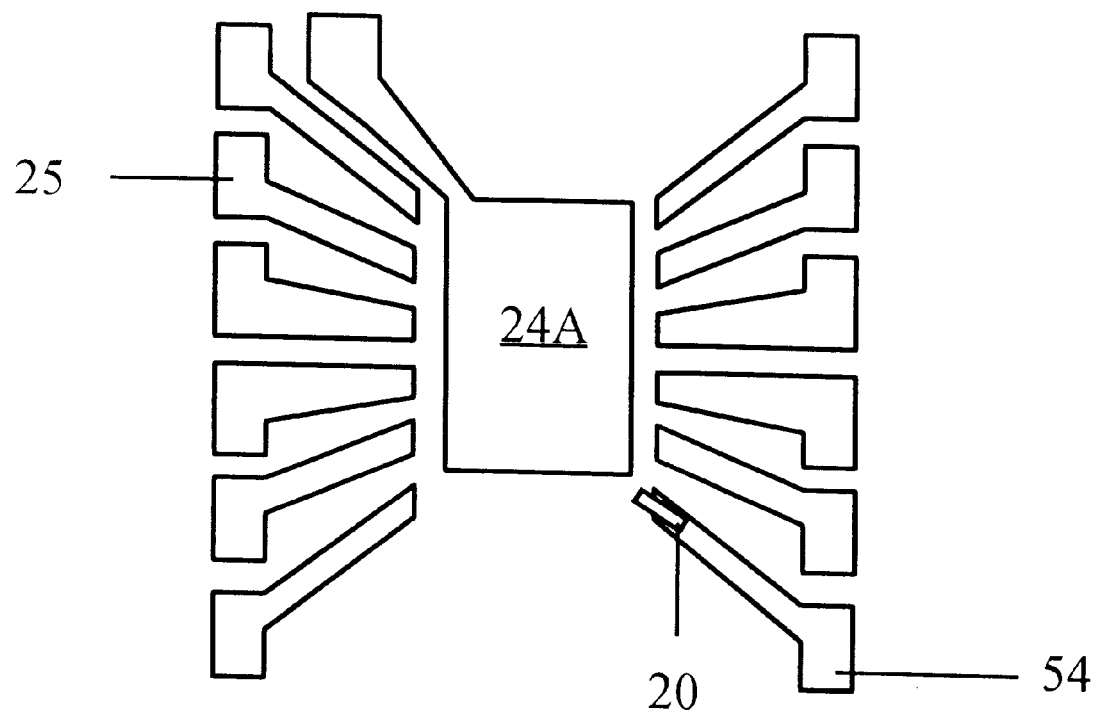
FIG. 5A shows a third embodiment of the IC package with a resettable fuse.
Figure 5B:
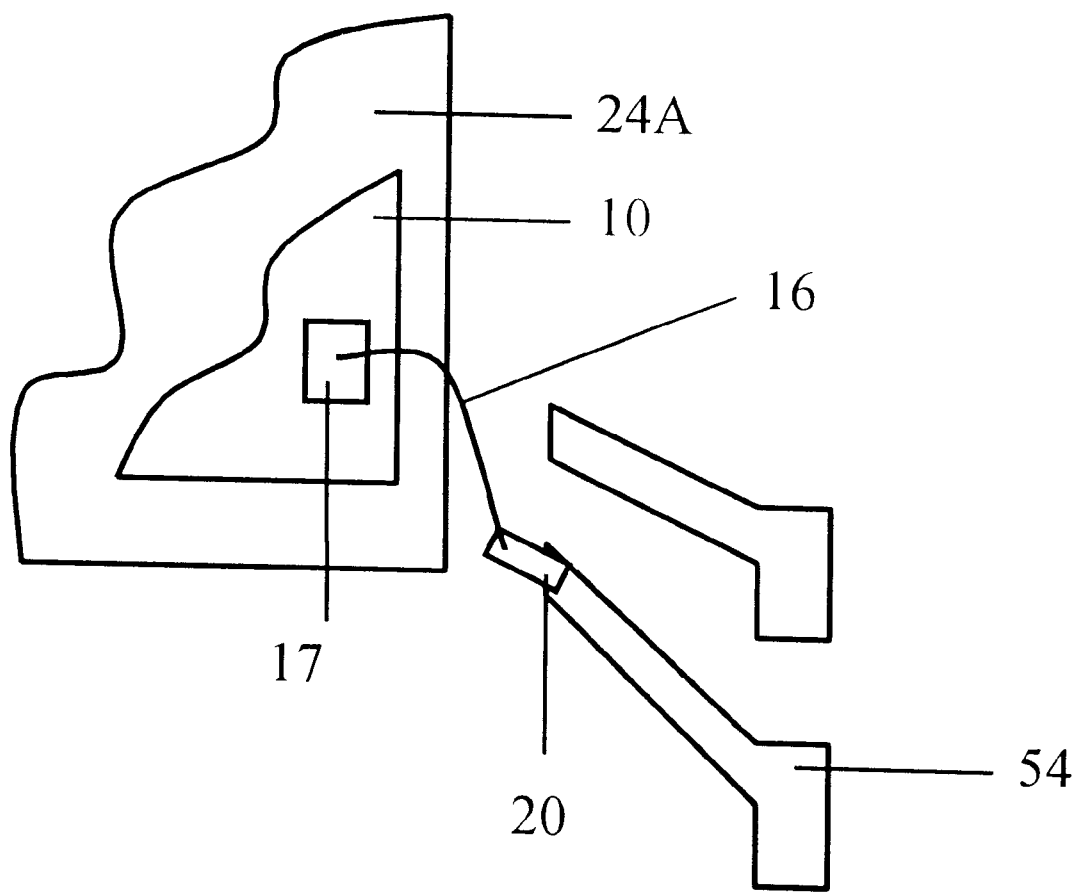
FIG. 5B shows the detailed connection of the resettable fuse.

FIG. 5A shows a third embodiment of the present invention as applied to the package shown in FIG. 2B. A resettable fuse 20 is directly mounted on one of the extensions 54 serving as a terminal for the IC. The detailed connection is shown in FIG. 5B. One end of the resettable fuse is bonded to the extension 54. The other end of the resettable fuse 20 is wire bonded by wire 16 to the bonding pad 17 on the IC chip 10, which is mounted on the heat sink 24A, This structure saves one extension for interconnection.

While the foregoing description is devoted to a package for integrated circuits, the structure is applicable to other semiconductor chips such as image sensor chip package, etc. Although the structure is described in terms of ball grid array, the technique is useful to other kinds of packages, such as flat pas, surface mount packages, etc. regardless of the density of pins. While the preferred embodiments of the invention have been described, it will be apparent to those skilled in the art that various modifications may be made in the embodiments for the package without departing from the spirit of the present invention. Such modifications are all within the scope of this invention.

What is claimed is:

1. A resettable package for semiconductor devices, comprising:

a substrate;

a semiconductor chip having bonding pads and mounted on said substrate;

a terminals coupled to said bonding pads;

at least one resettable fuse connected in series between one of said bonding pads and one of said terminals.

2. A resettable package as described in claim 1, further comprising a metallic link between said resettable fuse and said bonding pad.

3. A resettable package as described in claim 1, further comprising a metal sheet forming:
- a heat sink over which said semiconductor chip is mounted, and
- metal extensions of said bonding pads to form said terminals; and
- said resettable fuse connected between two said extensions.

4. A resettable package as described in claim 3, further comprising a metal sheet forming:
- a heat sink over which said semiconductor chip is mounted, and
- metal extensions of said bonding pads to form said terminals, and
- said resettable fuse mounted on one of said extensions.

5. A resettable package as described in claim 4, wherein the end said restettable fuse not mounted on said extension is wire-bonded to one of said pads.

* * * * *